(12) United States Patent
Zhang et al.

(10) Patent No.: US 11,486,927 B2
(45) Date of Patent: Nov. 1, 2022

(54) BODE FINGERPRINTING FOR CHARACTERIZATIONS AND FAILURE DETECTIONS IN PROCESSING CHAMBER

(71) Applicant: Applied Materials, Inc., Santa Clara, CA (US)

(72) Inventors: Tao Zhang, San Ramon, CA (US); Upendra V. Ummethala, Cupertino, CA (US); Ajit Balakrishna, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 392 days.

(21) Appl. No.: 16/838,834

(22) Filed: Apr. 2, 2020

(65) Prior Publication Data

US 2021/0311114 A1  Oct. 7, 2021

(51) Int. Cl.
*G01D 21/02* (2006.01)
*G05B 13/02* (2006.01)
(Continued)

(52) U.S. Cl.
CPC ......... *G01R 31/3177* (2013.01); *G01D 21/02* (2013.01); *G01F 1/8436* (2013.01); *G01F 1/86* (2013.01); *G05B 13/025* (2013.01)

(58) Field of Classification Search
CPC .. G01R 31/3177; G01D 21/02; G01F 1/8436; G01F 1/86; G05B 13/025
See application file for complete search history.

(56) References Cited

U.S. PATENT DOCUMENTS 6,917,049 B2 * 7/2005 Krah .................... G05B 13/024
                                                       250/221
9,634,600 B2 * 4/2017 Miklosovic ............. H02P 23/14
(Continued)

FOREIGN PATENT DOCUMENTS

JP    2018-111878    7/2018
WO    2018-089161    5/2018

OTHER PUBLICATIONS

Tektronix "Power Analysis Demo Guide LAB 5: Frequency Response Analysis", Copyright © 2016, Tektronix (Year: 2016).*
(Continued)

*Primary Examiner* — Regis J Betsch
(74) *Attorney, Agent, or Firm* — Lowenstein Sandler LLP

(57) ABSTRACT

A non-transitory computer-readable storage medium stores instructions, which when executed by a processing device of a diagnostic server, cause the processing device to perform certain operations. The operations include receiving, from a processing chamber, (i) measurement values of a combined signal that is based on an injection of an alternating signal wave onto a first output signal of a controller of the processing chamber, and (ii) measurement values of a second output signal of the controller that incorporates feedback from the processing chamber. The operations further include generating, based on the measurement values of the combined signal and the measurement values of the second output signal of the controller, a baseline bode fingerprint pertaining to a state associated with the processing chamber. The operations further include storing, in computer storage, the baseline bode fingerprint to be used in performing diagnostics of the processing chamber.

21 Claims, 11 Drawing Sheets

(51) Int. Cl.
    *G01F 1/84*          (2006.01)
    *G01R 31/3177*   (2006.01)
    *G01F 1/86*          (2006.01)

(56)                   References Cited

U.S. PATENT DOCUMENTS

| | | |
|---|---|---|
| 9,637,814 B2 | 5/2017 | Bugyi et al. |
| 9,887,865 B2 * | 2/2018 | Tezuka .................... G05D 3/12 |
| 2002/0022903 A1 | 2/2002 | Krah et al. |
| 2005/0115502 A1 | 6/2005 | George et al. |
| 2018/0138015 A1 * | 5/2018 | Ghantasala ....... H01J 37/32935 |
| 2019/0139796 A1 | 5/2019 | Lee et al. |

OTHER PUBLICATIONS

PCT Notification of Transmittal of The International Search Report and The Written Opinion Of The International Searching Authority for PCT Application No. PCT/US2021/025573, mailed 9 pages.

* cited by examiner

FIG. 8B  Open Loop Gain Responses

FIG. 8C  Closed-loop Sensitivity Responses

BODE FINGERPRINTING FOR CHARACTERIZATIONS AND FAILURE DETECTIONS IN PROCESSING CHAMBER

TECHNICAL FIELD

Embodiments of the present disclosure relate to bode fingerprinting for characterizations and failure detections in a processing chamber.

BACKGROUND

Changes to the components of a processing chamber impacts various processing parameters and whether the processing chamber meets strict tolerances in process variations. This is due to the increasingly small dimensions, and thus high precision (e.g., within nanometer accuracy), required in semiconductor-processed components and integrated chips. Accordingly, even a small change in hardware performance may show up in variation of etch results within processing chambers. The processing chamber components include structural mechanical, electrical, gas-flow-related, and exhaust-purge-related components. Errors in processing may be detected or are revealed with increasing frequency as these components age over time and with repetitive use. Dealing with such errors sometimes involves shutting down the processing system to perform diagnostics, parts replacement, and calibrations, which involves downtime and inefficiencies. Much of this downtime is spent in diagnosing issues to determine which components may be the root cause of such errors.

SUMMARY

Some of the embodiments described herein cover methods for a processing chamber gathering data to be used in bode fingerprinting. In one embodiment, a method includes injecting, by a signal generator of a chamber signal manager, an alternating signal wave onto an output signal of a controller that controls a setting within a processing chamber. The injecting generates a combined signal that is fed into an actuator that is to adjust the setting. The method may further include measuring, by a sensor coupled to the processing chamber, a response value in response to the combined signal for the setting. The method may further include calculating, by a comparator of the chamber signal manager, a difference between a setpoint input and the response value. The method may further include adjusting, by the controller based on the difference, the setting via changes to the output signal. The method may further include sending, by the chamber signal manager, the combined signal and the changed output signal to a diagnostic server to generate a baseline bode fingerprint pertaining to a state associated with the processing chamber, the baseline bode fingerprint to be used in performing diagnostics of the processing chamber.

In related embodiments, described herein are methods or related software for receiving the diagnostic data from the processing chamber and generating a bode fingerprint for use in performing diagnostics of the processing chamber. In one embodiment, a non-transitory computer-readable storage medium stores instructions, which when executed by a processing device of a diagnostic server, cause the processing device to perform operations. The operations may include receiving, from a processing chamber, (i) measurement values of a combined signal that is based on an injection of an alternating signal wave onto a first output signal of a controller of the processing chamber, and (ii) measurement values of a second output signal of the controller that incorporates feedback from the processing chamber. The operations may further include generating, based on the measurement values of the combined signal and the measurement values of the second output signal of the controller, a baseline bode fingerprint pertaining to a state associated with the processing chamber. The operations may further include storing, in computer storage, the baseline bode fingerprint to be used in performing diagnostics of the processing chamber.

In a further embodiment for a processing chamber gathering data to be used in bode fingerprinting, a method may include injecting, by a signal generator of a chamber signal manager, an alternating signal wave into a mass flow controller (MFC) of the chamber signal manager. The method may further include controlling, by the MFC, a flow ratio controller (FRC) coupled to a processing chamber, the FRC to control pressure dynamics within the processing chamber via adjustments to a gas nozzle. The method may further include generating, by a manometer coupled to the processing chamber, a pressure measurement value of the processing chamber. The method may further include inputting, into the feedback controller using a comparator, a difference between a pressure setpoint and the pressure measurement value. The method may further include adjusting, by the feedback controller, the pressure dynamics within the processing chamber in response to the difference. The method may further include sending, by the chamber signal manager, the alternating signal wave, the output of the FRC, and the pressure measurement value to a diagnostic server to generate a baseline bode fingerprint to be used in performing diagnostics of the processing chamber.

In a further embodiment generating a bode fingerprint for use in performing diagnostics of the processing chamber, a method may include receiving, from a chamber signal manager of a processing chamber: an alternating signal wave injected into a mass flow controller (MFC); and a pressure measurement value detected by a manometer coupled to the processing chamber. The method may further include generating, by a processor, a first baseline bode fingerprint based on at least the alternating signal wave and the pressure measurement value, and storing, by the processor within a computer storage, the first baseline bode fingerprint for later use in processing chamber diagnostics.

Numerous other features are provided in accordance with these and other embodiments of the disclosure. Other features and embodiments of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 8B is a graph of example open-loop gain responses from bode fingerprint data for three different processing chamber components, according to embodiments.

FIG. 8C is a graph of example closed-loop sensitivity responses from a bode fingerprint for three different processing chamber components, according to an embodiment.

DETAILED DESCRIPTION OF EMBODIMENTS

Figure 1:
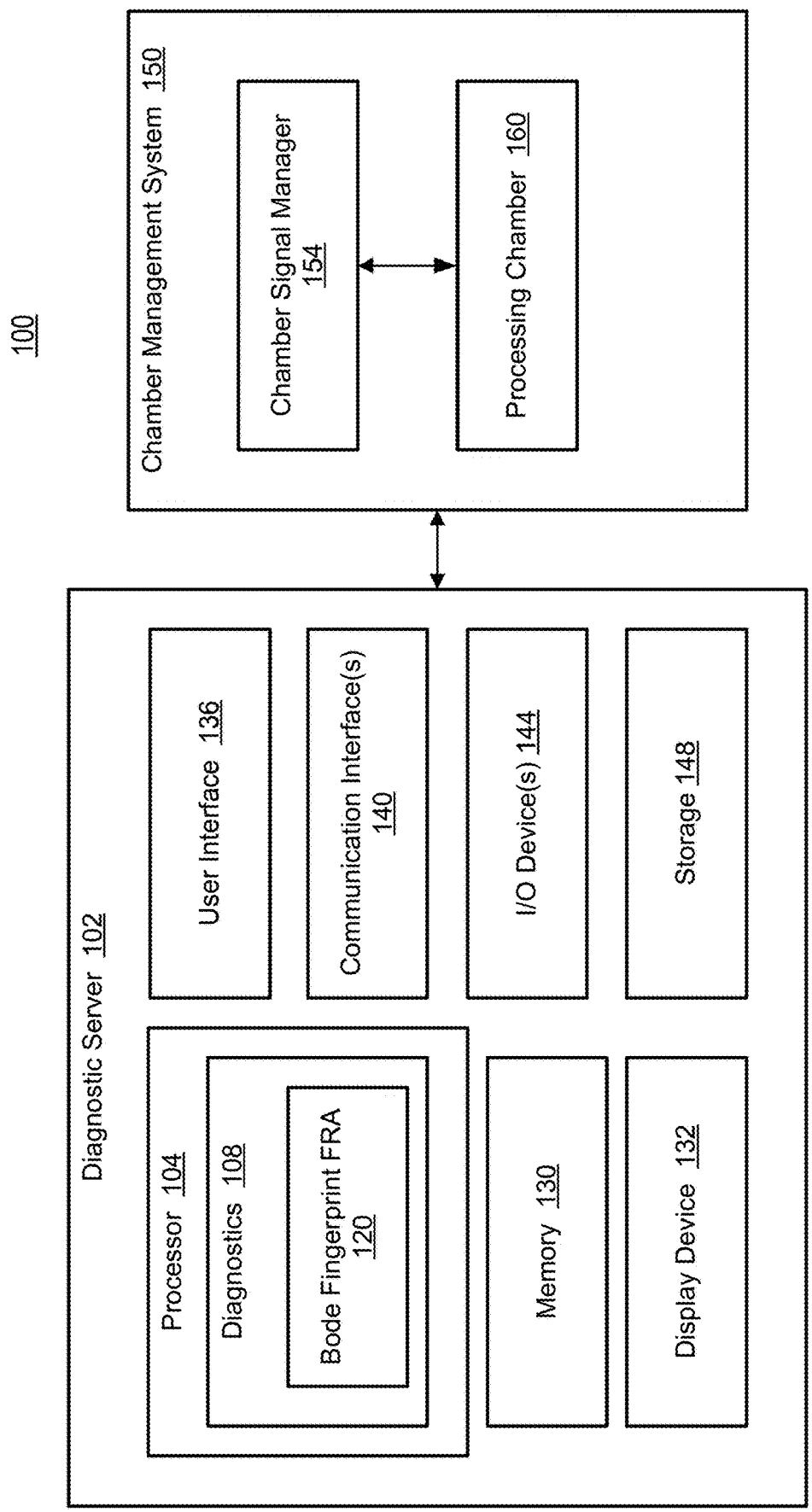
FIG. 1 is a block diagram of an example client-server architecture involving a diagnostic server and a chamber management system, according to various embodiments.

Embodiments described herein are related to systems and methods for use in characterizing a processing chamber and diagnosing faults or failures associated with the processing chamber. A processing chamber includes an electromechanical, multi-component system for processing substrates to manufacture a variety of semiconductor products, including integrated chips and other components (e.g., control boards) used in today's electronics. The processing chamber includes a number of hardware components, electrical components, electromechanical components (e.g., robotics), parameter settings (e.g., temperature, pressure, current, impedance, and the like), and calibrations associated with these components and settings. The substrates are usually processed under vacuum and with the use of deposition and etching that involve corrosive gases. The corrosive environment mixed with the repetitive use of the components of the processing chamber lead to errors and failures as the processing chamber and its supporting sub-systems age with use. For example, the processing chamber can go through performance drift that may cause manufactured parts to be outside of the strict tolerances previously discussed.

In various embodiments, disclosed are systems and methods for characterizing the processing chamber and its various components, as well diagnosing which of many components could be operating out of tolerance specifications (e.g., beginning to fail), or that have already failed. The characterizing may be performed by measuring behavior of the processing chamber when the processing chamber is first put into use, e.g., to generate a baseline bode fingerprint, and measuring its behavior again periodically during operation to generate additional bode fingerprints. A bode fingerprint may be generated based on varying a frequency of an input signal of a feedback control loop through the processing chamber, collecting frequency domain response data based on the input signal at two or more points of the control loop, and then processing the collected frequency domain response data to generate the bode fingerprint.

In corresponding embodiments, the later-generated bode fingerprints may be compared with the baseline bode fingerprint to detect an amount of change between a later-generated bode fingerprint and the baseline bode fingerprint. If the amount of change is greater than a threshold value, then a diagnostic server performing the analysis may alert an operator, initiate maintenance, or the like. The diagnostic server may also analyze the differences in the bode fingerprints (e.g., between the two bode plot curves) in order to diagnosis a particular embodiment or component of the processing chamber that is the reason for the amount of change, e.g., is failing or has failed. The particular component may then be replaced or the particular embodiment updated or resolved, e.g., with maintenance and/or recalibration. After component replacement or maintenance that restores proper tolerances in processing, a new baseline bode fingerprint may be generated.

In some embodiments, if the particular component or sub-system is not identifiable from a processing chamber level bode fingerprint analysis, additional data may be collected from isolated feedback control on an individual component or sub-system of the processing chamber. For example, the behavior may be individually isolated to a particular type of behavior, e.g., via sensors, actuators, pressure, flow rate, temperature, radio frequency (RF) conductance, and the like, associated with the individual component or sub-system of the processing chamber. The diagnostic server may then analyze the isolated data, e.g., generate a more-specific bode fingerprint that can be compared with a baseline bode fingerprint for that individual component or sub-system in order to step through different components and/or sub-systems of the processing chamber until a defective one is detected. This process can be repeated as desired until a defect or failure is detected that may be causing processing outside of intended tolerances (or other processing issues).

In various embodiments, the disclosed systems and methods involve many advantages, including, but not limited to, being able to diagnosis defaults, defects, or chamber drift before actual failure of a component or sub-system. This allows for proactive maintenance that may prolong the life of some components or sub-systems, or at the very least, be able to plan downtime that may be required in order to replace the failing component or sub-system. Further, some maintenance and even component replacement may now be performed while the processing chamber is under vacuum, and thus the down-time involved with going to atmospheric pressure for replacement or repair can be avoided. Additional or different advantages will be apparent to those of ordinary skill in the art as explained with reference to the present figures.

FIG. 1 is a block diagram of an example client-server architecture 100 involving a diagnostic server 102 and a chamber management system 150, according to various embodiments. The chamber management system 150 may include, but not be limited to, a chamber signal manager 154 coupled to a processing chamber 160. The processing chamber 160 may include the components and sub-systems previously referred to, such as the physical chamber, electrostatic chuck (ESC) assembly, and electrical systems that actuate mechanical (e.g., robotic) parts associated with processing substrates within the physical chamber.

In various embodiments, there are two basic kinds of systems for which a bode fingerprint can be generated, namely open loop and closed loop. These are frequency domain calculations intended to test frequency domain responses to inputs that have a varying frequency. An open loop system may be viewed as an input, X(f), that is processed by a system (e.g., a plant or G(f)) that generates a frequency response in an output, Y(f). In the disclosed embodiments, the plant or G(f) is associated with the processing chamber 160 or a sub-system thereof. In an open loop system, G(f) may be expressed as Y(f) divided by X(f), or Y(f)/X(f). Bode charts are plots of amplitude of G(f) versus frequency and plots of phase of G(f) versus frequency. Because G(f) is a complex value, G(f) can be represented as real and imaginary values of amplitude and phase.

In a closed loop system, the output Y(f) may be fed back into the process G(f) as feedback within the control system. In embodiments, closed loop bode data generated by the feedback control system may enable generation of a sensitivity plot, e.g., amplitude of 1/(1+G(f)) verses frequency, closed loop gain, e.g., the amplitude of Y(f)/X(f) versus frequency and bandwidth values, gain margin (GM), and phase margin (PM) of the control system. The bandwidth, GM, and PM are characteristics of the control system that may be used to represent stability (e.g., stability margin), robustness, and performance in reference to the specification tolerances and other requirements of the processing chamber 160. The bode data and bode fingerprints generated from that bode data, as referenced herein, may be either or both of open loop and closed loop control responses.

In various embodiments, the chamber signal manager 154 is adapted to inject an alternating signal wave onto an output signal of a controller that controls a setting within (or in association with) the processing chamber 160. The injection of the alternating signal wave (e.g., a sinusoidal waveform) generates a combined signal that is fed into an actuator that is to adjust the setting. In embodiments, the chamber signal manager 154 causes the alternative signal wave to continuously change its frequency, e.g., based on a user-defined frequency range. The types of sensors and actuators involved with measuring and adjusting different settings will be discussed in more detail herein with reference to FIG. 3, FIG. 4A, FIG. 5, and FIG. 6A.

In various embodiments, the diagnostic server 102 includes, but is not limited to, a processor 104 (e.g., processing device), a memory 130, a display device 132, a user interface 136, a communication interface 140, input/output (I/O) device(s) 144, and storage 148 (e.g., computer storage or non-transitory computer-readable memory in which is stored software instructions executable by the processor 104). The processor 104 may further include a diagnostics component 108 that is adapted to execute a bode fingerprint frequency response analysis (FRA) 120. The memory 130 may include a dual in-line memory module (DIMM), a small outline DIMM (SO-DIMM), and/or a non-volatile dual in-line memory module (NVDIMM) or other volatile memory. The storage 148 may be a storage device such as a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Other computer storage and/or storage devices are envisioned.

In disclosed embodiments, the bode fingerprint FRA 120 receives, from the processing chamber 160, (i) measurement values of a combined signal that is based on the injection of the alternating signal wave onto a first output signal of a controller of the processing chamber, and (ii) measurement values of a second output signal of the controller that incorporates feedback from the processing chamber. The bode fingerprint FRA 120 may further generate, based on the measurement values of the combined signal and the measurement values of the second output signal of the controller, a baseline bode fingerprint pertaining to a state associated with the processing chamber. The bode fingerprint FRA 120 may further store, in the storage 148, the baseline bode fingerprint to be used in performing diagnostics of the processing chamber 160.

The bode fingerprint FRA 120 may then, at a later point in time, receive, from the processing chamber, (i) measurement values of an updated combined signal based on injection of the alternating signal wave onto an updated first output signal of the controller, and (ii) measurement values of an updated second output signal of the controller that incorporates feedback from the processing chamber. The bode fingerprint FRA 120 may generate, based on the measurement values of the updated combined signal and measurement values of the updated second output signal, an updated bode fingerprint. The bode fingerprint FRA 120 may detect an amount of change between the baseline bode fingerprint and the updated bode fingerprint, and alert an operator of a fault or defect in response to determining that the amount of change is greater than a threshold value. The amount of change may be with respect to a low frequency gain or resonance shift, for example.

In various embodiments, the updated bode fingerprint is generated based on updated bode plot data. The diagnostic server 102 may further calculate, using conductance curves of the updated bode plot data, a gain margin (GM), a phase margin (PM), and a bandwidth (BW) of a closed-loop frequency response at different frequencies of a signal generator used to generate the alternating signal wave (see FIG. 9B). The diagnostic server 102 may further calculate, based on at least one of the gain margin, the phase margin, or the bandwidth, one of a stability or robustness measurement of a chamber signal manager of the processing chamber. The stability (or stability margin) may be in reference to how fast a closed loop control system can track (or follow) a reference input, e.g., within a closed-loop sensitivity response (see FIG. 9D). If there is a lot of overshoot or undershoot in control response, the stability margin may be lacking. The stability and robustness measurements may further indicate a disturbance rejection capability at different frequencies, e.g., how much attenuation the control system can provide at ranges of frequencies.

In various embodiments, the display device 132 is a screen and associated circuitry that is coupled to the processor 104 and adapted to display diagnostic results generated by the processor 104. These diagnostic results may include bode fingerprints as well as results of comparison between a baseline bode fingerprint and a later-generated bode fingerprint, as discussed. The I/O devices 144 may allow input of (e.g., through the user interface 136) settings or an identification of which setting to focus on in creation of bode fingerprints. The operator or user may also input the defined frequency range of the alternating signal wave through the user interface 136 for use by the chamber signal manager 150. The processor 104 may further alert an operator or user of the diagnostic server 102 through the display device 132 and/or one of the I/O devices 144, e.g., as an audio alert. In one embodiment, the I/O device 144 is a mobile application executed on a mobile device that is communicatively coupled with the diagnostic server 102. The alert may indicate detection of a defect or of operation outside of tolerance (including potential failure of) a processing component or sub-system of the processing chamber 160.

In various embodiments, the communication interface 140 may facilitate the diagnostic server 102 communicating to the chamber management system 150 the setting(s) for which to generate the diagnostic data. The communication interface 140 may further facilitate receipt of the diagnostic data from the chamber management system 150. In some embodiments, the diagnostic data include measurement values of a combined signal that is based on injection of the alternating signal wave onto the first output signal of a controller of the processing chamber. The diagnostic data may further include measurement values of a second output signal of the controller that incorporates feedback from the processing chamber. Additional or alternative diagnostic data will be discussed throughout this disclosure that may be communicated to the diagnostic server 102.

Figures 2A, 2B:
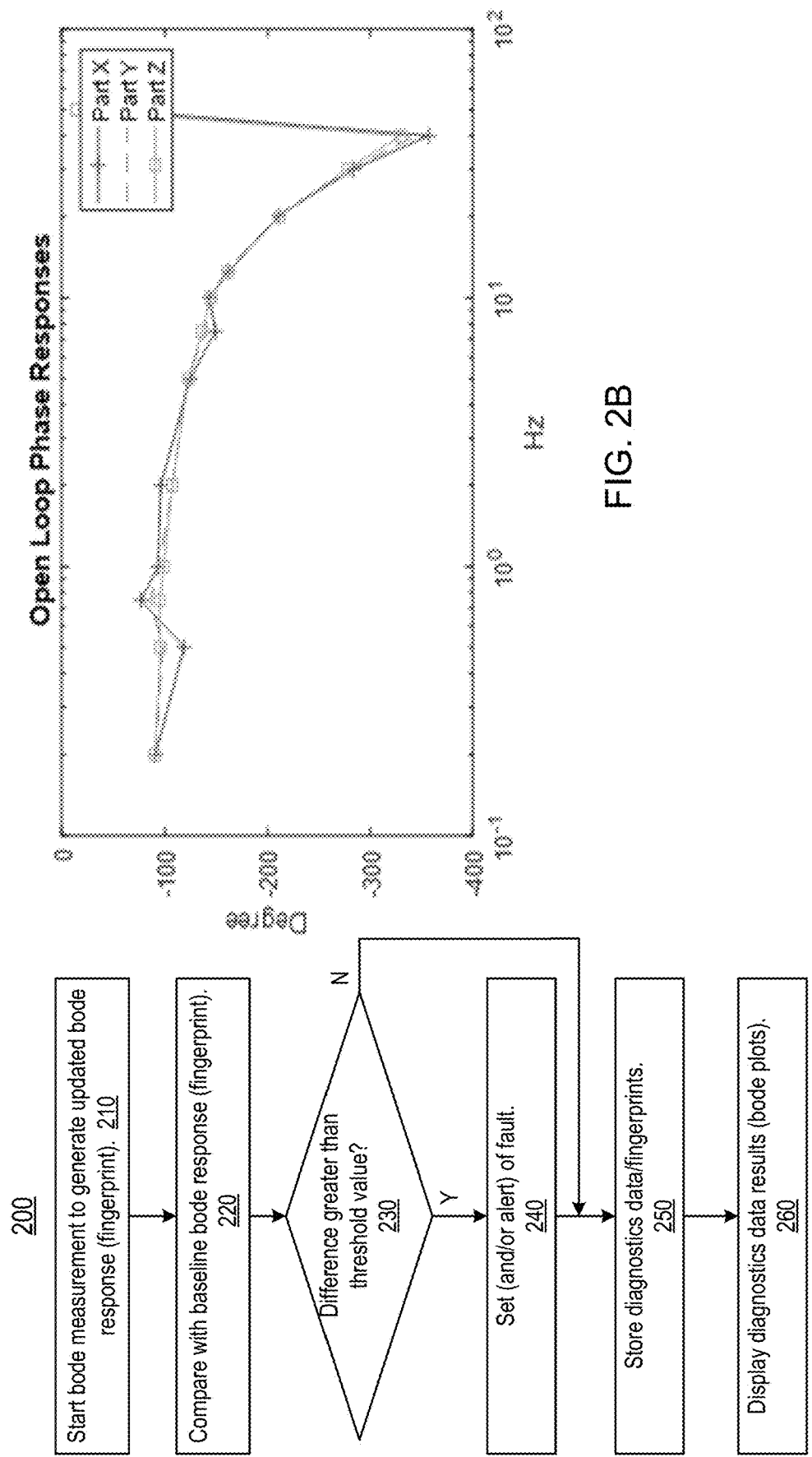
FIG. 2A is a flow chart of a method for processing chamber diagnosis using a bode fingerprint, according to various embodiments.
FIG. 2B is a graph illustrating example open-loop phase responses from bode fingerprint data for three different processing chamber components, according to various embodiments.

FIG. 2A is a flow chart of a method 200 for processing chamber diagnosis using a bode fingerprint, according to various embodiments. FIG. 2B is a graph illustrating example open-loop phase responses from bode fingerprint data for three different processing chamber components, according to various embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the diagnostic server 102 (FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 2A, at operation 210, the processing logic starts bode measurements of the processing chamber 160 to generate an updated bode response such as an updated bode fingerprint. The processing logic may signal, to the chamber management system 150, a setting, component, or sub-system for which the bode fingerprint is to be generated. In embodiments, the setting may be associated with a particular component or sub-system, as will be explained in more detail.

With additional reference to FIG. 2A, at operation 220, the processing logic compares the updated bode fingerprint with the baseline bode fingerprint to generate a difference between the two fingerprints. The baseline bode fingerprint would have been generated previously at the diagnostics server 102 using bode data from a system when it is first put into operation. In an alternative embodiment, the baseline fingerprint is generated by the diagnostic server 102 after replacement of a component within and/or performance of maintenance and recalibration on the processing chamber 160.

At operation 230, the processing logic determines whether the difference between the baseline bode fingerprint and the updated bode fingerprint is greater than a threshold value. The threshold value may be tied to a tolerance level for a particular setting, component, or sub-system within the processing chamber 160. If the answer is no, then the processing logic skips past the fault setting and/or alert generation operation(s). If the answer is yes, at operation 240, the processing logic sets a fault in the processing server 102. The fault may also, or alternatively, be communicated to the operator as an alert, e.g., on the display device 132, through an I/O device 144 (such as a speaker), or to a communicatively coupled mobile device.

At operation 250, the processing device stores the diagnostic data, which may include the updated bode fingerprint(s), e.g., in the storage 148. Herein, bode fingerprints may also be referred to or considered to be bode plots. At operation 260, the processing logic may display diagnostic data results such as bode plots of the baseline and updated bode fingerprints in the display device 132, an example of which is illustrated in FIG. 2B. In this way, an operator may correlate and/or quantify an alert with bode plot data.

In various embodiments, the frequency responses of the bode plots (or fingerprints) may reflect resonances and anti-resonances, indicating the frequencies at which the highest and lowest amplitudes occur. The bode plots may further indicate an amount of damping, e.g., as a mechanism for absorbing energy. Further, the bode plots may be indicative of the phase-lag of the frequency response relative to the input excitation. When the frequency responses of a processing component (or sub-system) changes significantly over time, the frequency response can indicate potential failure to part faults, electrical drifting, mechanical wear, or resonance changing.

Figure 3:
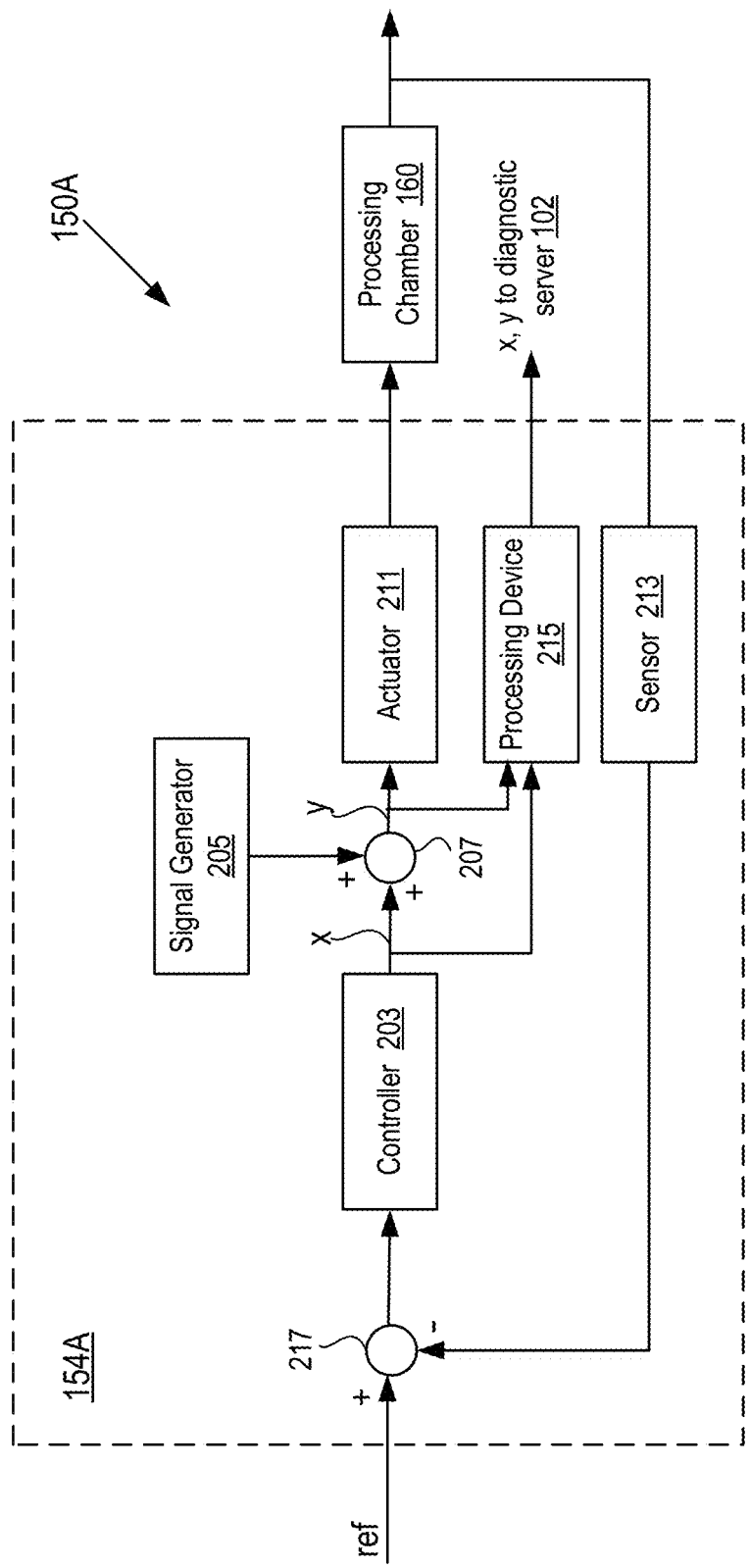
FIG. 3 is a block diagram of feedback control between a chamber signal manager and a processing chamber of the chamber management system of FIG. 1, according to an embodiment.

FIG. 3 is a block diagram of feedback control between a chamber signal manager and a processing chamber of the chamber management system of FIG. 1, according to an embodiment. In one embodiment, a chamber management system 150A includes a chamber signal manager 154A and the processing chamber 160. In this embodiment, the chamber signal manager 154A includes a controller 203, a signal generator 205, an actuator 211, a sensor 213, a processing device 215, and a comparator 217. In one embodiment, the processing device 215 is a communication device such as a base station, a router, or other wired or wireless access point that is built into or made a part of the chamber signal manager 154A. In an alternative embodiment, the processing device 215 is combined into the controller 203.

In various embodiments, the signal generator 205 injects an alternating signal wave (e.g., sinusoidal waveform such as a sine or cosine waveform) via the summer 207 onto an output signal (x) of the controller 203, which generates a combined signal (y) that is fed into the actuator 211. The actuator 211 in turn may adjust a setting (e.g., pressure) within the processing chamber based on the combined signal, y. In embodiments, the signal generator 205 may continuously change a frequency of the alternating signal wave in a user-defined frequency range (e.g., from 0.1 Hz to 10 Hz or other frequency range) in order to generate the bode data with which the diagnostic server 102 may generate bode fingerprints usable for diagnostic of the processing chamber. Further, the signal generator 205 may use a second order digital filter in generation of the alternating signal wave.

In various embodiments, the sensor 213 (e.g., a manometer) then measures the adjustment to the setting (e.g., pressure) by generating a response value. While a response value is referenced to simplify explanation, it should be understood that multiple responses values are generated, one for each data point as the signal generator 205 varies a frequency of the alternating signal wave. The subsequent operations may be performed on each respective response value, in turn, in order to generate bode response data. In disclosed embodiments, the response value from the sensor 213 is fed back into the controller 203 via the comparator 217. For example, the comparator 217 may compare the response value to a setpoint input, e.g. reference value (ref), to generate a difference between the setpoint input and the response value. The setpoint input (or reference value) may be set externally to the processing chamber, e.g., by the diagnostic server 102 or other source. The controller 203 may then adjust the setting, based on the difference, via changes to the output signal, x, which is again to be injected with the alternating signal wave from the signal generator 205. Herein the output signal (or x) may also be referred to as the changed output signal based on the feedback control loop of FIG. 3.

The processing device 215 of the chamber signal manager 154A may then send the combined signal (y) and the changed output signal (x) to the diagnostic server 102 to generate a baseline bode fingerprint pertaining to a state associated with the processing chamber, the baseline bode fingerprint to be used in performing diagnostics of the processing chamber 160. In one embodiment, the bode fingerprint includes an open loop magnitude and phase calculated by dividing the Discrete Fourier Transform of x, DFT(x), by the DFT of y, e.g., DFT(y).

Further, the injecting, the measuring, the calculating, and the adjusting may be performed again at a later point in time to generate an updated combined signal (y') and an updated output signal (x'). The controller 203 may send the updated combined signal and the updated output signal to the diagnostic server 102 to generate an updated bode fingerprint to be compared with the baseline bode fingerprint in performing the diagnostics of the processing chamber 160.

In various embodiments, the setting being tested may be associated with a particular sub-system (e.g., process and/or control sub-system) which may be isolated in the case that a fault is detected for the entire processing chamber 160, but the precise root cause for the fault cannot be determined. Table 1 illustrates a list of such systems and associated components, corresponding to those illustrated in FIG. 3, that may be involved in generation of the bode response data. Note that TCP stands for "transformer coupled plasma" associated with reactor etching, ESC stands for "electrostatic chuck," and RF stands for "radio frequency."

TABLE 1

| | Sensor 213 | Actuator 211 | Setting | Setpoint Input (ref) |
|---|---|---|---|---|
| Pressure Control System | Manometer | Symmetric Flow Valve (SFV) | Chamber Pressure Dynamics | Pressure Setpoint |
| ESC Control Temperature | Temperature Sensor (on ESC) | Heater | ESC Thermal Dynamics | Temperature Setpoint |
| Impedance Control | Mag/Phase Sensor | Motor Driving Capacitors | Chamber Impedance | Impedance Setpoint |
| TCP Coil Current Control | Current Sensor | RF Power | Chamber Coil RF Dynamics | Current Setpoint |

Figure 4A:
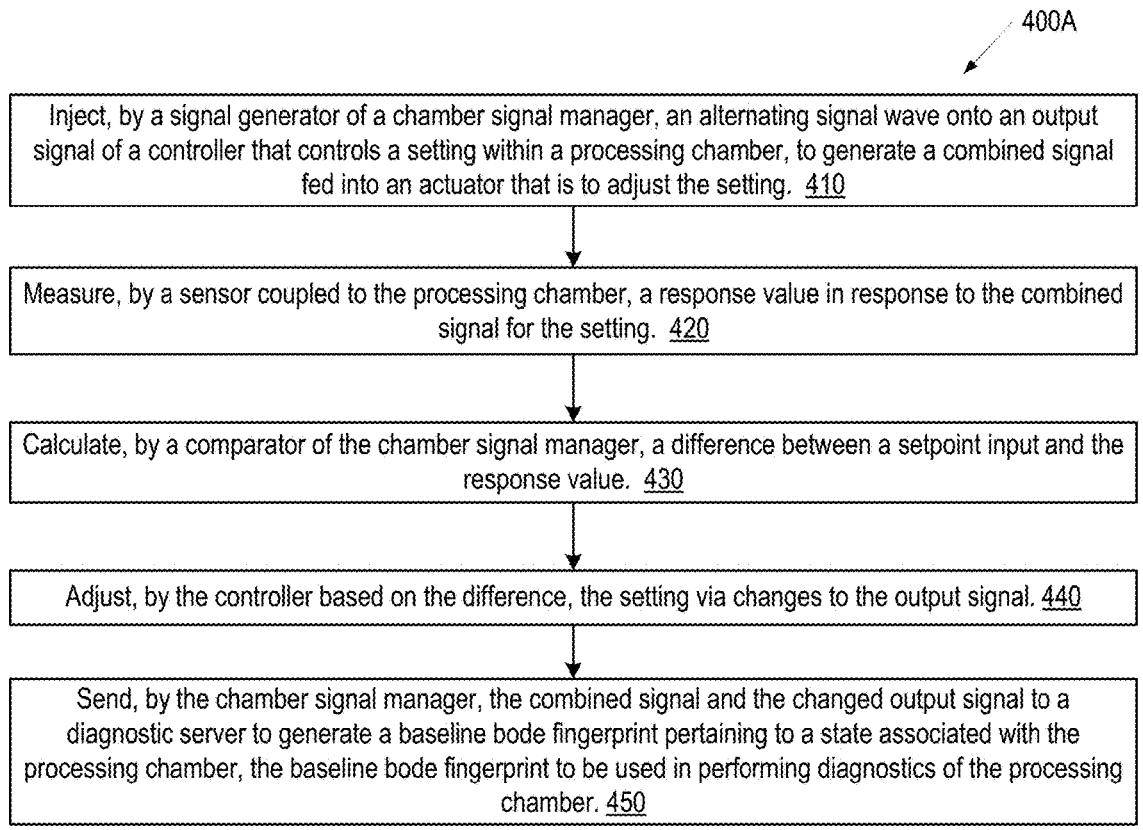
FIG. 4A is a flow chart of a method for collecting data associated with the processing chamber of FIG. 3 for use in bode fingerprinting analysis, according to an embodiment.

FIG. 4A is a flow chart of a method 400A for collecting data associated with the processing chamber 160 of FIG. 3 for use in bode fingerprinting analysis, according to an embodiment. The method 400A can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400A is performed by the chamber signal manager 154A (FIG. 3). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 4A, at operation 410, the processing logic (e.g., of the signal generator 205 of the chamber signal manager 154A) injects an alternating signal wave onto an output signal of a controller that controls a setting within a processing chamber. This injecting may generate a combined signal that is fed into the actuator 211 that is to adjust the setting. Operation 410 may further include continuously changing, by the signal generator 205, a frequency of the alternating signal wave in a user-defined frequency range. Further, the actuator 211 may be one of a symmetric flow value, a heater, a motor driving capacitors, or radio frequency (RF) power, for example. The setting may be, for example, one of chamber pressure dynamics, ESC thermal dynamics, chamber impedance, or chamber coil RF dynamics.

At operation 420, the processing logic (e.g., the sensor 213 coupled to the processing chamber 160) measures a response value in response to the combined signal for the setting. The sensor 213 may include, for example, a manometer, a temperature sensor on an ESC, a magnitude and phase sensor, or a current sensor.

At operation 430, the processing logic (e.g., the comparator 217) may calculate a difference between a setpoint input (ref) and the response value. The setpoint input (e.g., reference value) may be received or triggered externally to the processing chamber. In various embodiments, the setpoint input is one of a pressure setpoint, a temperature setpoint, an impedance setpoint, or a current setpoint. At operation 440, the processing logic (e.g., the controller 203) adjusts, based on the difference, the setting via changes to the output signal, e.g., x. These changes may continue into the combined output signal, y, which is input into the actuator 211 for the next data point.

At operation 450, the processing logic (e.g., the processing device 115 of the chamber signal manager 154A) sends the combined signal and the changed output signal to the diagnostic server 102 to generate a baseline bode fingerprint pertaining to a state associated with the processing chamber 160. The baseline bode fingerprint may then be used in performing diagnostics of the processing chamber 160 (FIG. 2A).

While not illustrated in FIG. 4A, the method 400A may be extended with the processing logic performing the injecting, the measuring, the calculating, and the adjusting again at a later point in time to generate an updated combined signal and an updated output signal from the processing chamber 160, e.g., from the chamber signal manager 154A. The method 400A may further include the processing logic sending the updated combined signal and the updated output signal to the diagnostic server to generate an updated bode fingerprint to be compared with the baseline bode fingerprint in performing the diagnostics of the processing chamber (FIG. 2A).

Figure 4B:
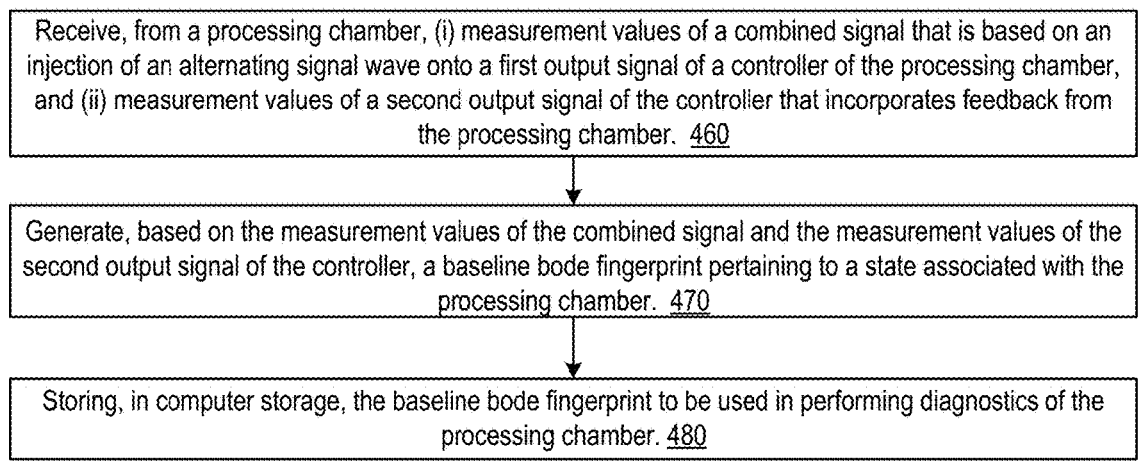
FIG. 4B is a flow chart of a method for analyzing the collected data to generate a baseline bode fingerprint that is to be used in performing diagnostics of the processing chamber of FIG. 3, according to an embodiment.

FIG. 4B is a flow chart of a method 400B for analyzing the collected data to generate a baseline bode fingerprint that is to be used in performing diagnostics of the processing chamber of FIG. 3, according to an embodiment. The method 400B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400B is performed by the diagnostic server 102 (FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 4B, at operation 460, the processing logic receives, from the processing chamber 160 (e.g., the chamber signal manager 154), (i) measurement values of a combined signal that is based on an injection of an alternating signal wave onto a first output signal of a controller of the processing chamber, and (ii) measurement values of a second output signal of the controller that incorporates feedback from the processing chamber. FIG. 4A discusses what these measurement values are generated (from the perspective of one measurement value at a time). For example, the first output signal may be the output signal, x, and the second output signal may be the combined signal output, y.

At operation 470, the processing logic generates, based on the measurement values of the combined signal and the measurement values of the second output signal of the controller, a baseline bode fingerprint pertaining to a state associated with the processing chamber. At operation 480, the processing logic stores, in the computer storage, the baseline bode fingerprint to be used in performing diagnostics of the processing chamber 160.

Figure 4C:
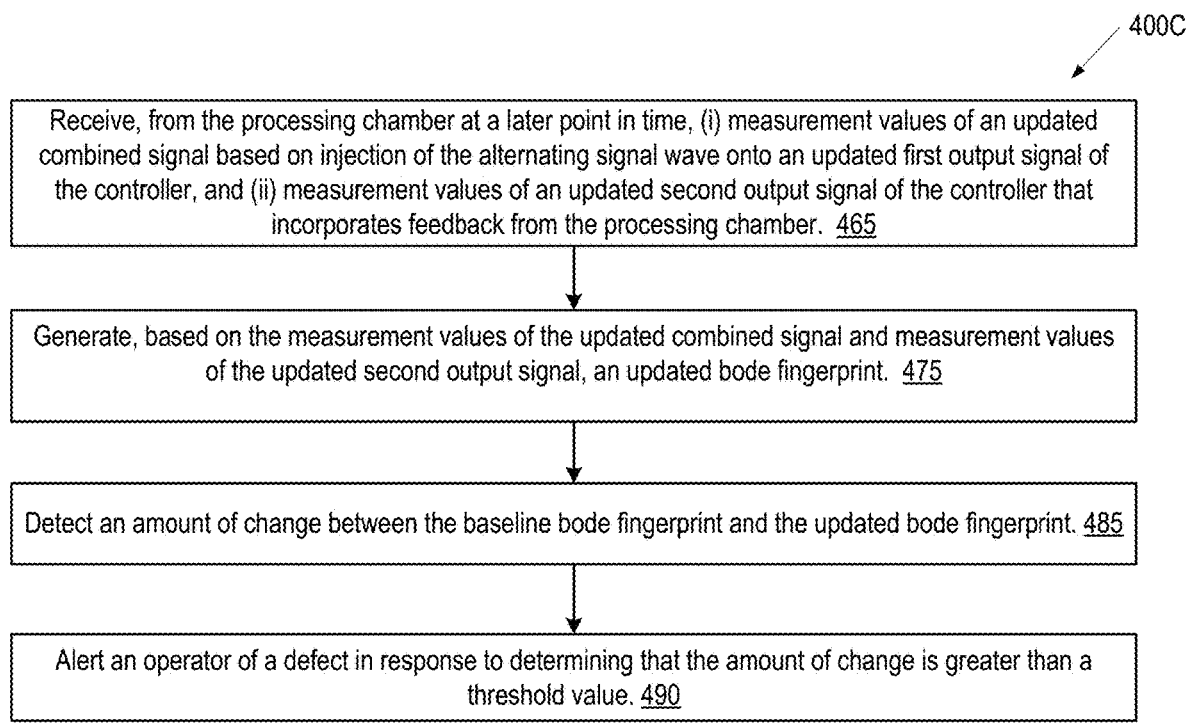
FIG. 4C is a flow chart of a method for analyzing the collected data at a later point in time to generate an updated bode fingerprint to compare with the baseline bode fingerprint (FIG. 4B) to detect a fault and/or alert an operator, according to various embodiments.

FIG. 4C is a flow chart of a method 400C for analyzing the collected data at a later point in time to generate an updated bode fingerprint to compare with the baseline bode fingerprint to detect a fault and/or alert an operator, according to embodiments. The method 400C can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400C is performed by the diagnostic server 102 (FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 4C, at operation 465, the processing logic receives, from the processing chamber at a later point in time, (i) measurement values of an updated combined signal based on injection of the alternating signal wave onto an updated first output signal of the controller, and (ii) measurement values of an updated second output signal of the controller that incorporates feedback from the processing chamber.

At operation 475, the processing logic generates, based on the measurement values of the updated combined signal and measurement values of the updated second output signal, an updated bode fingerprint. At operation 485, the processing logic detects an amount of change between the baseline bode fingerprint (generated as per FIG. 4B) and the updated bode fingerprint, e.g., via bode plot comparative analysis. At operation 490, the processing logic alerts an operator of a defect (or fault) in response to determining that the amount of change is greater than a threshold value. The operation 680 may also, or alternatively, including setting the fault within the diagnostic server 102 in a way that enables the alerting of the operation or user.

In some embodiments, the alert of the operator of the default or defect may be in relation to the processing chamber 160 as a whole, without indication of which component or sub-system is the root cause of the default or defect. In these cases, the operator (or the diagnostic server 102) may initiate a new series of bode data collection and analysis to generate a bode fingerprint of a more specific setting, component, or sub-system, by way of attempting to isolate the source of the defect or default.

Figure 5:
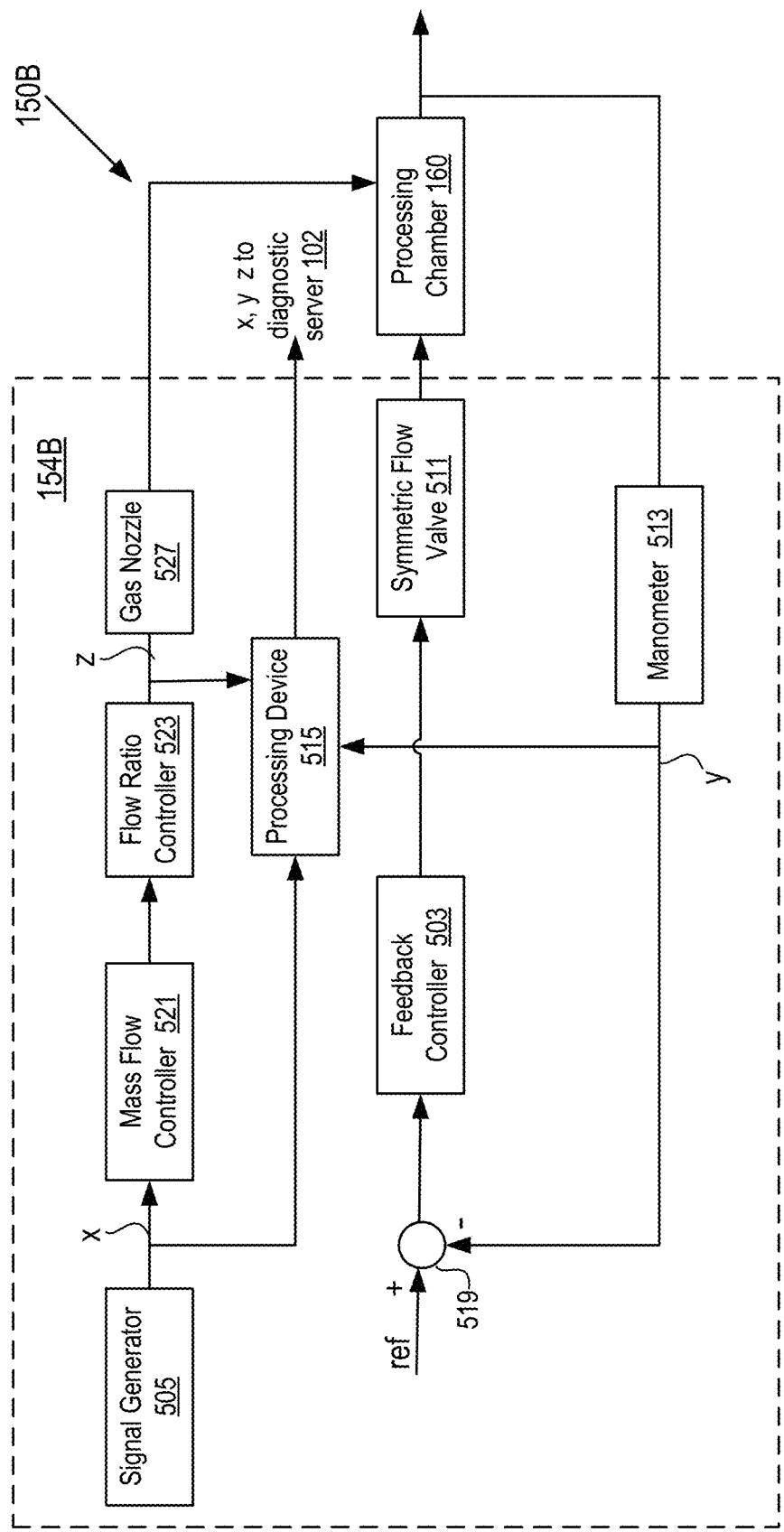
FIG. 5 is a block diagram of feedback control involving pressure dynamics between a chamber signal manager and a processing chamber of the chamber management system of FIG. 1, according to an embodiment.

FIG. 5 is a block diagram of feedback control involving pressure dynamics between a chamber signal manager and a processing chamber of the chamber management system of FIG. 1, according to an embodiment. In embodiments, a chamber management system 150B includes a chamber signal manager 154B and the processing chamber 160. In this embodiment, the chamber signal manager 154B includes a feedback controller 503, a signal generator 505, a symmetric flow valve (SFV) 511, a manometer 513 (e.g., a pressure sensor), a processing device 515, a comparator 519, a mass flow controller (MFC) 521, a flow ratio controller (FRC) 523, and a gas nozzle 527. In some embodiments, the gas nozzle 527 and SFV 511 may be considered a part of the processing chamber 160, although is illustrated in this embodiment (for simplicity) as part of the chamber signal manager 154B. In one embodiment, the processing device 515 is a communication device such as a base station, a router, or other wired or wireless access point that is built into or made a part of the chamber signal manager 154B. In an alternative embodiment, the processing device 515 is combined into the feedback controller 503.

In various embodiments, the signal generator 505 injects an alternating signal wave (e.g., sinusoidal waveform such as a sine or cosine waveform) into the MFC 521. In embodiments, the signal generator 505 may continuously change a frequency of the alternating signal wave in a user-defined frequency range (e.g., from 0.1 Hz to 10 Hz or other frequency range) in order to generate the bode data with which the diagnostic server 102 may generate bode fingerprints usable for diagnostics of the processing chamber. Further, the signal generator 205 may use a second order digital filter in generation of the alternating signal wave.

In some embodiments, the MFC 521 controls the FRC 523 to control pressure dynamics within the processing chamber 160 via adjustment to the gas nozzle 527. The gas nozzle 527 operates at a certain pressure and rate based on operation of the MFC 521 and FRC 523. By way of feedback, the manometer 513 can determine a pressure measurement value (y) of the processing chamber 160. In various embodiments, the processing device 515 receives the alternating signal wave (x), an output (z) of the FRC 523, and the pressure measurement value (y).

In disclosed embodiments, the comparator 519 may determine a difference between a pressure setpoint (ref) and the pressure measurement value, y. This difference (e.g., a difference value), received from the comparator 519, may be input into the feedback controller 503. The feedback controller 503 may then adjust the pressure dynamics (e.g., the pressure) within the processing chamber in response to the difference. The adjusting of the pressure dynamics may be performed via adjusting the conductance of the SFV 511 of a vacuum pump of the processing chamber 160. The SFV 511 may be a flow valve located at the bottom of the processing chamber 160 used to adjust the pressure within the processing chamber 160, e.g., of the vacuum pump.

In various embodiments, the processing device 515 of the chamber signal manager 154B sends the alternating signal wave (x), the output (z) of the FRC, and the pressure measurement value (y) to the diagnostic server 102 to generate a baseline bode fingerprint to be used in performing diagnostics of the processing chamber. In some embodiments, the baseline bode fingerprint may be made up of DFTs of x, y, and z. For example, the baseline bode fingerprint may include one or both of DFT(z)/DFT(x) and DFT(y)/DFT(x).

Further, the injecting, the controlling, the receiving, the inputting, and the adjusting may be performed a later point in time to generate an updated alternating signal wave (x'), an updated output (y') of the FRC, and an updated pressure measurement value (z'). The controller 503 may send the updated alternating signal wave, the updated output of the FRC, and the updated pressure measurement value to the diagnostic server to generate a updated bode fingerprint to be compared with the baseline bode fingerprint. Depending on how the updated bode fingerprint compares with the baseline bode fingerprint (e.g., within a threshold value), the diagnostic server 102 may detect a fault or other defect associated with the processing chamber 160. Such a fault may include process drift as was explained. Further examples of possible issues (e.g., defects or faults) may be detected as associated with the MFC 521, the FRC 523, the gas nozzle 527, or the SFV 511.

Figure 6A:
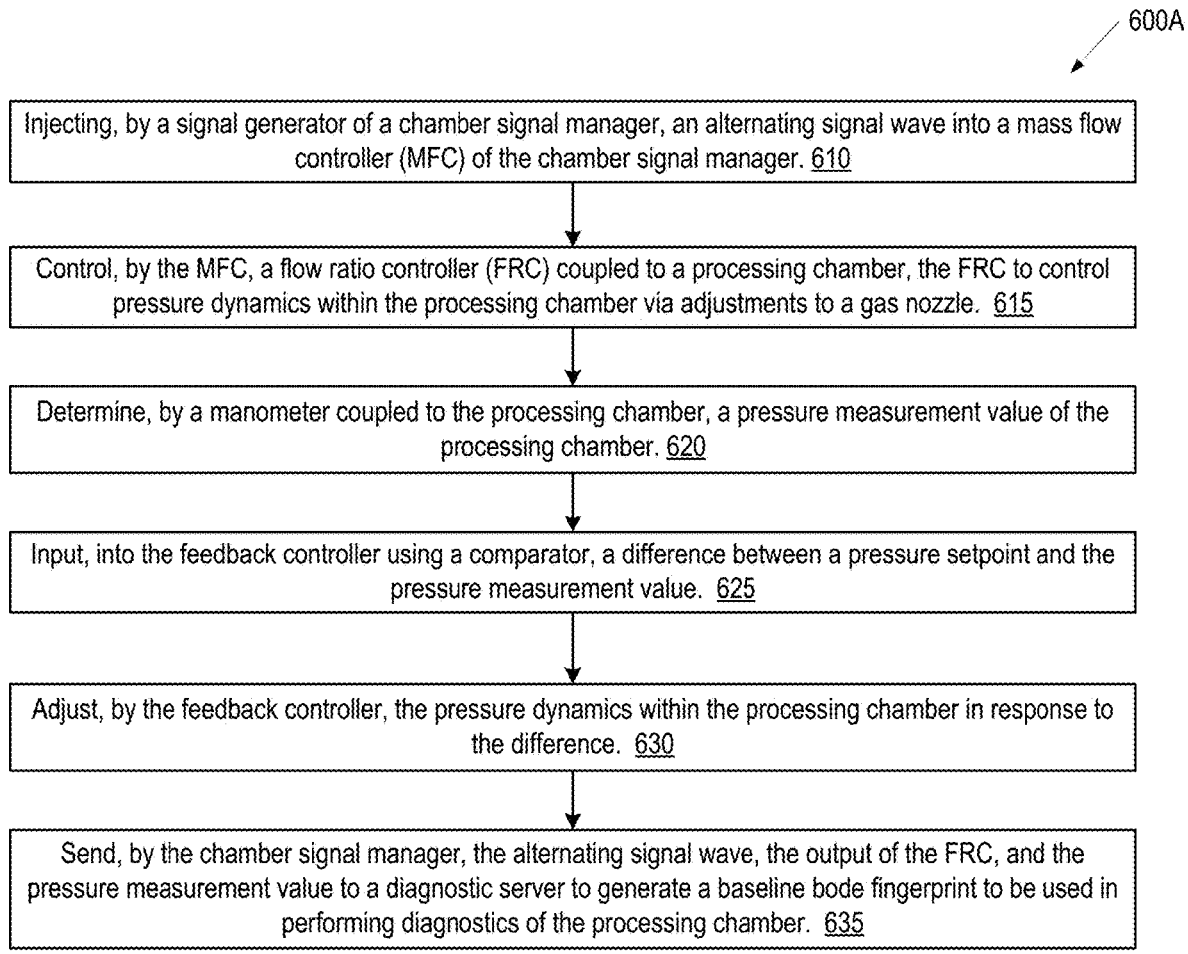
FIG. 6A is a flow chart of a method for collecting data associated with the processing chamber of FIG. 5 for use in bode fingerprinting analysis, according to an embodiment

FIG. 6A is a flow chart of a method 600A for collecting data associated with the processing chamber 160 of FIG. 5 for use in bode fingerprinting analysis, according to an embodiment. The method 600A can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600A is performed by the chamber signal manager 154B (FIG. 5). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 6A, at operation 610, the processing logic (e.g., of the signal generator 505 of the chamber signal manager 154B) injects an alternating signal wave into the mass flow controller (MFC) of the chamber signal manager. At operation 615, the processing logic (e.g., the MFC 521) controls a flow ratio controller (FRC) coupled to a processing chamber 169. The FRC 523 may function to control pressure dynamics within the processing chamber 160 via adjustments to the gas nozzle 527.

At operation 620, the processing logic (e.g., the manometer 513) may determine a pressure measurement value of the processing chamber. At operation 625, the processing logic (e.g., of the comparator 519) may input a difference between a pressure setpoint (ref) and the pressure measurement value into the feedback controller 503. At operation 630, the processing logic (e.g., of the feedback controller 503) adjusts the pressure dynamics (e.g., the pressure) within the processing chamber in response to the difference, e.g., by controlling the SFV 511 in one embodiment. In the latter embodiment, the adjusting may be performed via adjusting conductance of the symmetric flow valve (SFV) 511. At operation 635, the processing logic (e.g., the processing device 515 of the chamber signal manager 154B) sends the alternating signal wave, the output of the FRC, and the pressure measurement value to the diagnostic server 102 to generate a baseline bode fingerprint to be used in performing diagnostics of the processing chamber.

While not illustrated in FIG. 6A, the method 600A may be extended with the processing logic performing the injecting, the controlling, the determining, the inputting, and the adjusting at a later point in time to generate an updated alternating signal wave, an updated output of the FRC, and an updated pressure measurement value. The method 600A may further include the processing logic sending the updated alternating signal wave, the updated output of the FRC, and the updated pressure measurement value to the diagnostic server to generate a updated bode fingerprint to be compared with the baseline bode fingerprint (FIG. 2).

Figure 6B:
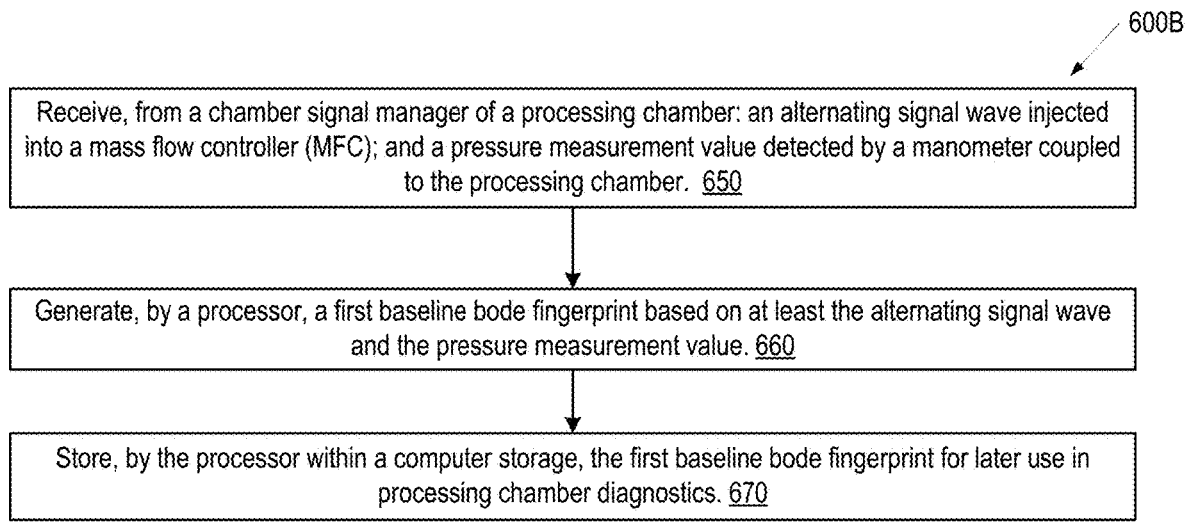
FIG. 6B is a flow chart of a method for analyzing the collected data to generate a baseline bode fingerprint that is to be used in performing diagnostics of the processing chamber of FIG. 5, according to an embodiment.

FIG. 6B is a flow chart of a method 600B for analyzing the collected data to generate a baseline bode fingerprint that is to be used in performing diagnostics of the processing chamber of FIG. 5, according to an embodiment. The method 600B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600B is performed by the diagnostic server 102 (FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 6B, at operation 650, the processing logic receives, from a chamber signal manager of a processing chamber: an alternating signal wave injected into a mass flow controller (MFC); and a pressure measurement value detected by a manometer coupled to the processing chamber. At operation 660, the processing logic generates a first baseline bode fingerprint based on at least the alternating signal wave and the pressure measurement value. At operation 670, the processing logic stores, within the computer storage, the first baseline bode fingerprint for later use in processing chamber diagnostics.

While not illustrated, the method 600B may be extended by the processing logic calculating a complementary response of the processing chamber 160 (see FIG. 9C) that is responsive to a difference between a pressure setpoint and the pressure measurement value (e.g., from the manometer 513). The complementary response may therefore how good the control system can follow a programmed flow using a setpoint reference. The method 600B may further include the processing logic calculating a closed-loop sensitivity response (see FIG. 9D), and combining complementary response data and closed-loop sensitivity data within first bode plot data as part of the first baseline bode fingerprint.

While not illustrated, the method 600B may be extended by the processing logic receiving, from the chamber signal manager, an output of the FRC 523 coupled to the MFC 521. The method 600B may then include the processing logic generating a second baseline bode fingerprint based on the alternating signal wave and the output of the FRC 523. The method 600B may further include the processing logic storing, within the computer storage, the second baseline bode fingerprint to be used in performing diagnostics of the processing chamber.

Figure 6C:
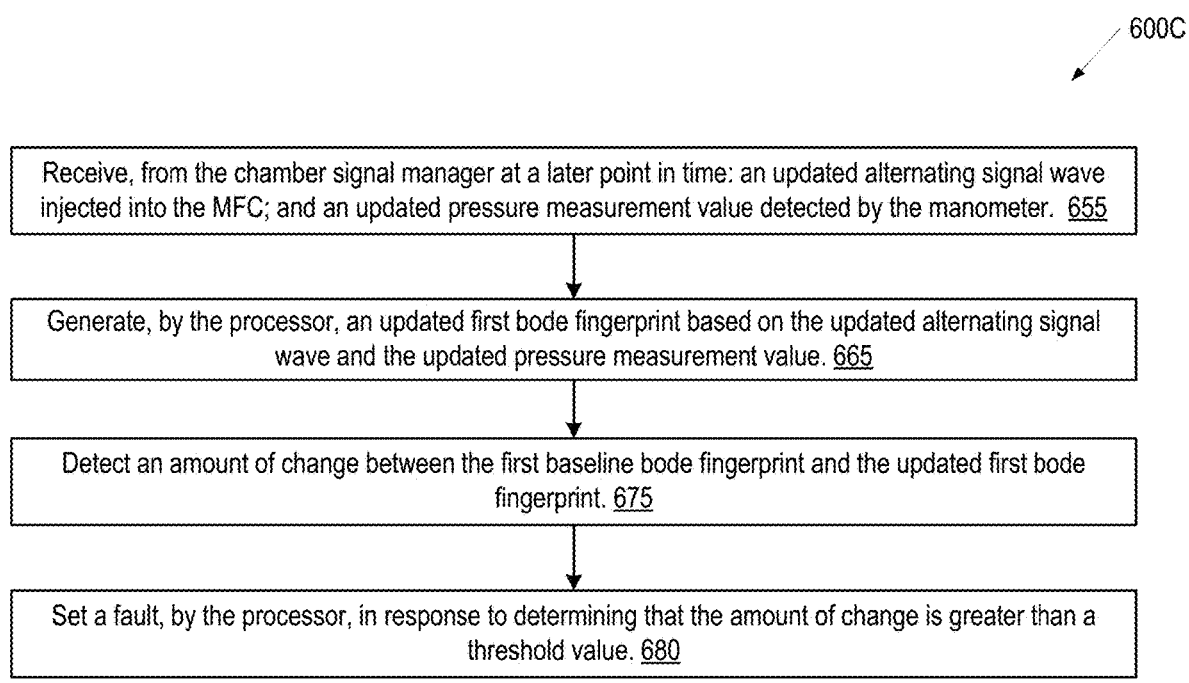
FIG. 6C is a flow chart of a method for analyzing the collected data to generate an updated bode fingerprint to compare with the baseline bode fingerprint (FIG. 6B) that is to be used to detect a fault and/or alert an operator, according to various embodiments.

FIG. 6C is a flow chart of a method 600C for analyzing the collected data to generate an updated bode fingerprint to compare with the baseline bode fingerprint (FIG. 6B) that is to be used to detect a fault and/or alert an operator, according to various embodiments. The method 600C can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600C is performed by the diagnostic server 102 (FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 6C, at operation 655, the processing logic receives, from the chamber signal manager 154B at a later point in time an updated alternating signal wave (x') injected into the MFC 521 and an updated pressure measurement value (y') detected by the manometer 513. At operation 665, the processing logic generates an updated first bode fingerprint based on the updated alternating signal wave and the updated pressure measurement value. For example, the updated first bode fingerprint may be DFT(y')/DFT(x').

At operation 675, the processing logic detects an amount of change between the first baseline bode fingerprint and the updated first bode fingerprint, e.g., via bode plot comparative analysis. At operation 680, the processing logic alerts an operator of a defect or fault in response to determining that the amount of change is greater than a threshold value.

In some embodiments, the operation of the method 600C of FIG. 6C may also be performed with relation to an updated alternating signal wave (x') injected into the MFC 521 and an updated output (z') of the FRC 523. In this embodiment, the updated bode fingerprint generated by the processing logic may be DFT(z')/DFT(x'). If the comparison of the updated bode fingerprint with the baseline bode fingerprint results in detecting a difference beyond the threshold value, the method 600C may further including setting a fault and/or alerting the operator of the default, e.g., as discussed with reference to FIG. 2.

In some embodiments, the alert of the operator of the default or defect may be in relation to the processing chamber 160 as a whole, without indication of which component or sub-system is the root cause of the default or defect. In these cases, the operator (or the diagnostic server 102) may initiate a new series of bode data collection and analysis to generate a bode fingerprint of a more specific setting, component, or sub-system, by way of attempting to isolate the source of the defect or default. In some embodiments, the source of the defect or default may be determined to be the MFC 521, the FRC 523, the gas nozzle 527, the SFV 511 or a combination thereof.

In some embodiments, the first baseline bode fingerprint is based on first bode plot data and the updated first bode fingerprint is based on second bode plot data. While not illustrated, the method 600C may be extended by the processing logic calculating, using conductance curves of at least one of the first or second bode plot data, a gain margin (GM), a phase margin (PM), or a bandwidth (BW) of a closed-loop frequency response at different frequencies of a signal generator that generates the updated alternating signal wave. The method 600C may further include the processing logic calculating, based on at least one of the gain margin, the phase margin, or the bandwidth, one of a stability or robustness measurement of a chamber management system that includes the chamber signal manager 154B and the processing chamber 160.

Figure 7:
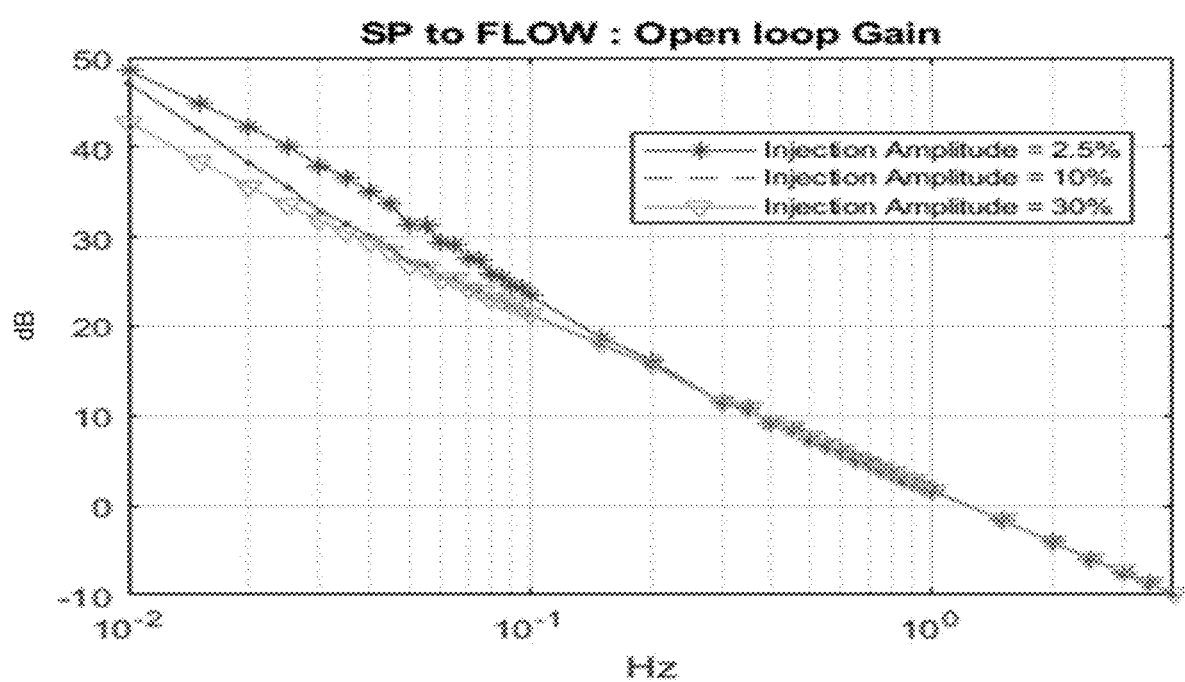
FIG. 7 is a graph illustrating open loop gain of a bode plot (e.g., fingerprint) of a nonlinear system according to an embodiment.

FIG. 7 is a graph illustrating open loop gain of a bode plot (e.g., fingerprint) of a nonlinear system according to an embodiment. The bode fingerprinting and processing chamber characterizations discussed previously may be extended to nonlinear characterizations, which may be illustrated within the bode plots or fingerprints that are discussed herein. Some of the components that may be nonlinear include the SFV 511, plasma dynamics, and RF matching networks employed in association with the processing chamber 160. For a nonlinear or time-varying system, when injecting one frequency sinusoidal wave into the system, the system output may contain frequencies other than the input frequency and the output-input ratio might be dependent on the input magnitude.

The bode plot in FIG. 7 illustrates the frequency responses of a mechanical system with hysteretic friction, e.g., the non-linearities in an MFC actuator. As can be seen, when the friction changes, the bode response changes at low frequency, which may indicate the possible mechanical faults due to friction or hysteresis. To characterize the behaviors of nonlinear systems, the injections of the alternating signal wave (e.g., sinusoidal wave) may be varied in amplitude when capturing data to be used in generating the bode fingerprints. To quantify the nonlinearity of the components, frequency distortion analysis may be calculated to measure an amount of energy at different harmonic frequencies.

Figure 8A:
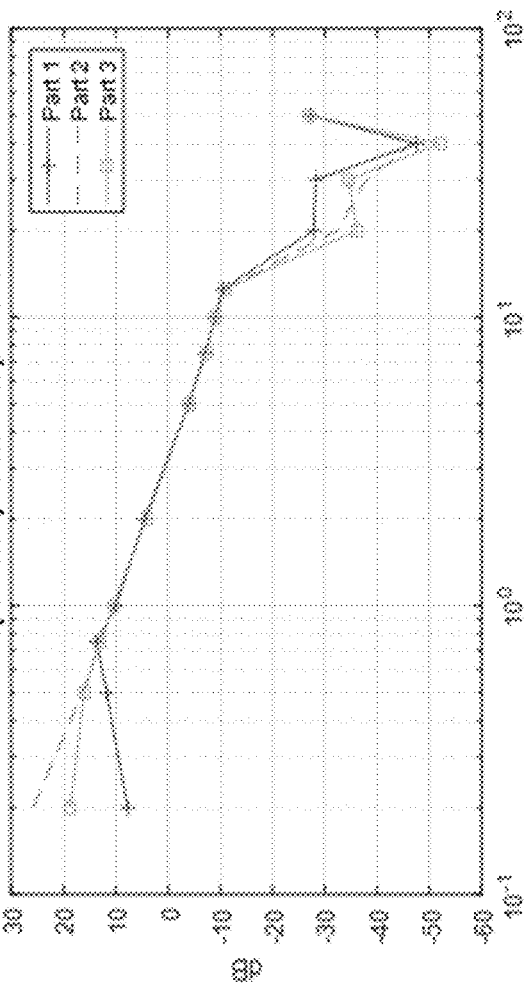
FIG. 8A is a flow chart of a method for performing bode fingerprint analysis for a nonlinear chamber management system, according to an embodiment.
Figure 8A:
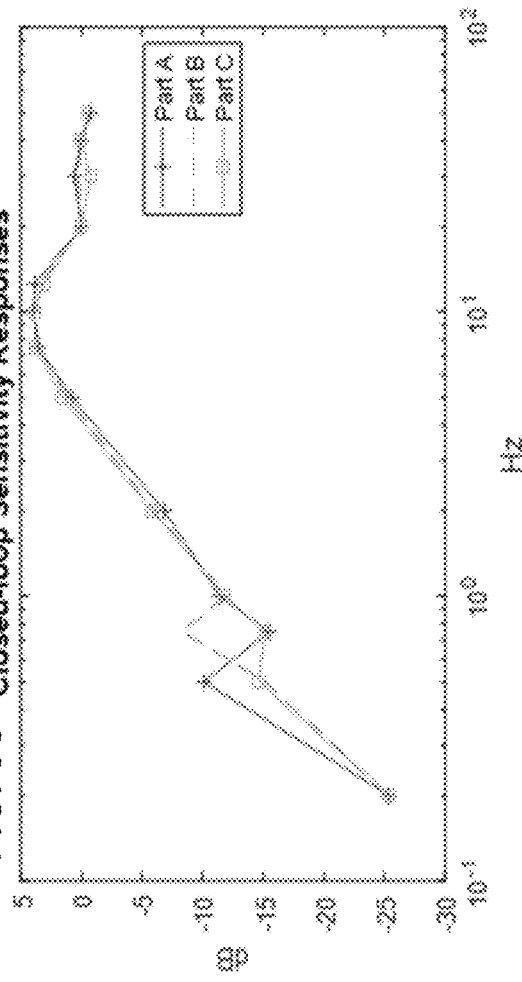
Figure 8A:
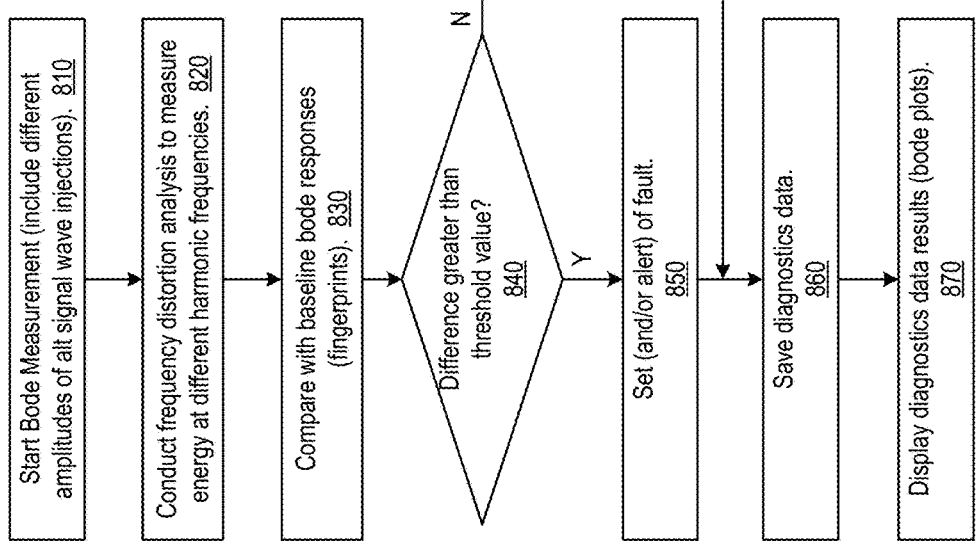

FIG. 8A is a flow chart of a method 800 for performing bode fingerprint analysis for a nonlinear chamber management system, according to an embodiment. FIG. 8B is a graph of example open-loop gain responses from bode fingerprint data for three different processing chamber components, according to embodiments. FIG. 8C is a graph of example closed-loop sensitivity responses from a bode fingerprint for three different processing chamber components, according to an embodiment.

The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the diagnostic server 102 (FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 8A, at operation 810, the processing logic starts bode measurements using different amplitudes of alternating signal wave injections in the operations discussed previously. At operation 820, the processing logic conducts frequency distortion analysis to measure energy at different harmonic frequencies. At operation 830, the processing logic compares the baseline bode fingerprints with updated bode fingerprints that measure the energy at the different harmonic frequencies, to generate a different of the two (e.g., a difference value). At operation 840, the processing logic determines whether the difference is greater than a threshold value. If the answer is no, than the processing logic skips setting a fault or generating an alert for an operator. If the answer is yes, at operation 850, the processing logic may set a fault in the processing server 102. The fault may also, or alternatively, be communicated to the operator as an alert, e.g., on the display device 132, through an I/O device 144 (such as a speaker), or to a communicatively coupled mobile device.

At operation 250, the processing logic stores the diagnostic data (e.g., the bode plot data) and associated bode fingerprint(s) in the computer storage. At operation 260, the processing logic displays the diagnostics data results, e.g., as bode plots of comparative bode plots. An example of open loop gain responses for three different processing chamber components is illustrated in FIG. 8B. An example of closed-loop sensitivity responses for the three different processing chamber components is illustrated in FIG. 8C. In the graphs of FIG. 8B and FIG. 8C, the low frequencies below 1 HZ may indicate the nonlinear responses due to actuator non-linearities.

Figure 9C:
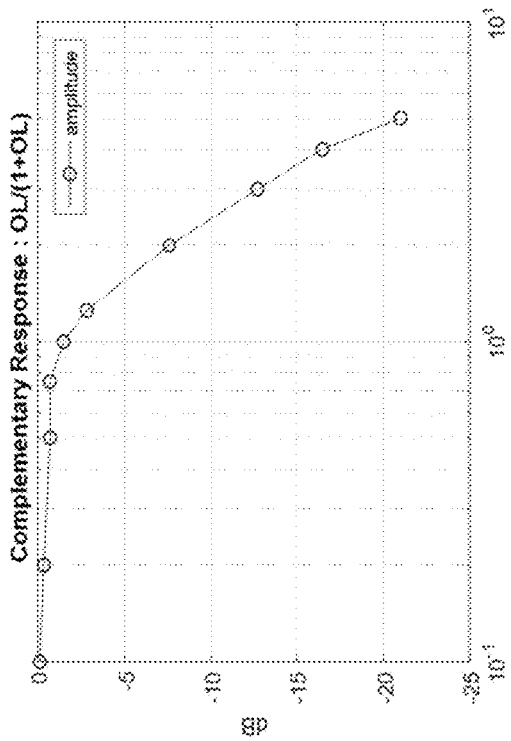
FIG. 9C is a graph of an example complementary response of a bode fingerprint, according to an embodiment.
Figure 9D:
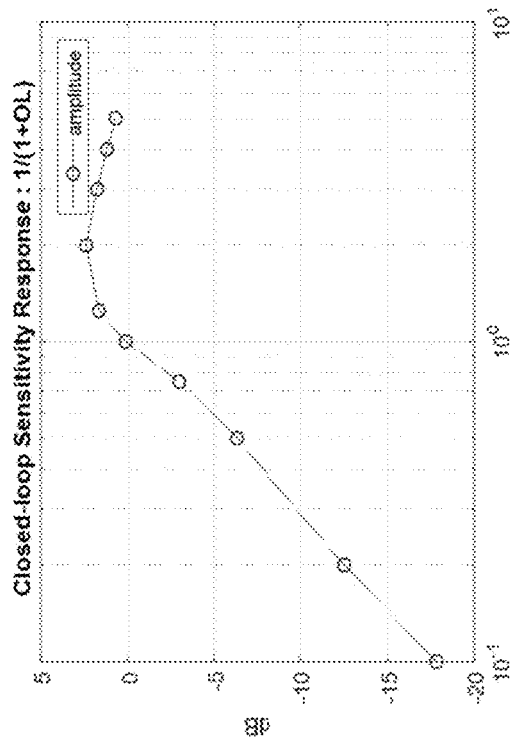
FIG. 9D is a graph of an example closed-loop sensitivity response of the bode fingerprint, according to an embodiment.
Figure 9A:
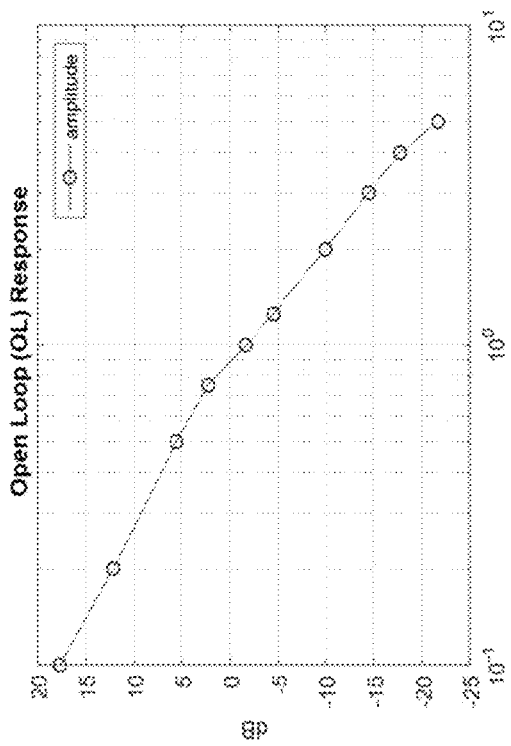
FIG. 9A and FIG. 9B are, respectively, a graph of an example amplitude and phase of an open-loop response bode fingerprint, according to an embodiment.
Figure 9B:
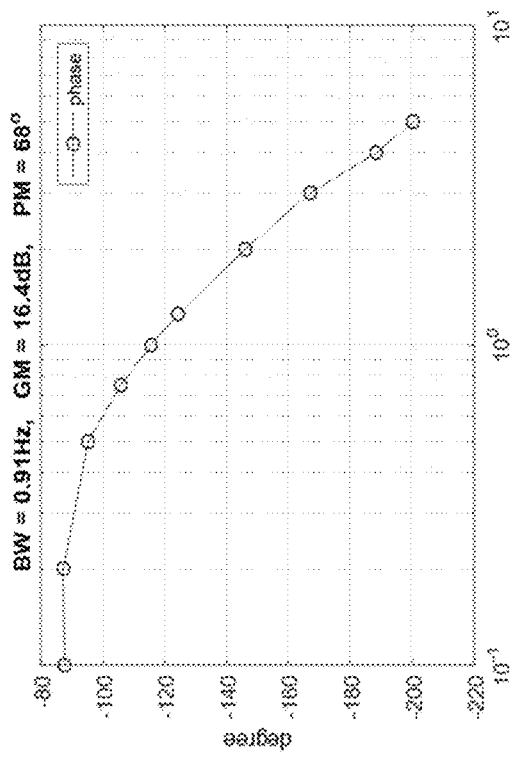

FIG. 9A and FIG. 9B are, respectively, a graph of an example amplitude and phase of an open-loop response bode fingerprint, according to an embodiment. With reference to FIG. 9B, the bandwidth (BW) may be determined as 0.91 Hz, with a gain margin (GM) or 16.4 dB, and a phase margin (PM) of 68 degrees. FIG. 9C is a graph of an example complementary response of a bode fingerprint, according to an embodiment. FIG. 9D is a graph of an example closed-loop sensitivity response of the bode fingerprint, according to an embodiment. In some embodiments, as discussed previously, the diagnostic server 102 may combine the complementary response data and closed-loop sensitivity data within a bode plot data as part of the a baseline bode fingerprint, and the same may be replicated at a later point in time in order to generate an update bode fingerprint to be compared to the baseline bode fingerprint.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
    injecting, by a signal generator of a chamber signal manager, an alternating signal wave onto an output signal of a controller that controls a setting within a processing chamber, wherein the injecting generates a combined signal that is fed into an actuator that is to adjust the setting;
    measuring, by a sensor coupled to the processing chamber, a response value in response to the combined signal for the setting;

calculating, by a comparator of the chamber signal manager, a difference between a setpoint input and the response value;

adjusting, by the controller based on the difference, the setting via changes to the output signal; and sending, by the chamber signal manager, the combined signal and the changed output signal to a diagnostic server to generate a baseline bode fingerprint pertaining to a state associated with the processing chamber, the baseline bode fingerprint to be used in performing diagnostics of the processing chamber.

2. The method of claim 1, further comprising continuously changing, by the signal generator, a frequency of the alternating signal wave in a user-defined frequency range.

3. The method of claim 1, further comprising:

performing the injecting, the measuring, the calculating, and the adjusting again at a later point in time to generate an updated combined signal and an updated output signal; and sending the updated combined signal and the updated output signal to the diagnostic server to generate an updated bode fingerprint to be compared with the baseline bode fingerprint in performing the diagnostics of the processing chamber.

4. The method of claim 1, wherein:

the sensor is one of a manometer, temperature sensor on an electrostatic chuck (ESC), a magnitude and phase sensor, or a current sensor;

the actuator is one of a symmetric flow value, a heater, a motor driving capacitors, or radio frequency (RF) power;

the setting is one of chamber pressure dynamics, ESC thermal dynamics, chamber impedance, or chamber coil RF dynamics; and the setpoint input is one of a pressure setpoint, a temperature setpoint, an impedance setpoint, or a current setpoint.

5. A non-transitory computer-readable storage medium that stores instructions, which when executed by a processing device of a diagnostic server, cause the processing device to perform a plurality of operations comprising:

receiving, from a processing chamber, (i) measurement values of a combined signal that is based on an injection of an alternating signal wave onto a first output signal of a controller of the processing chamber, and (ii) measurement values of a second output signal of the controller that incorporates feedback from the processing chamber;

generating, based on the measurement values of the combined signal and the measurement values of the second output signal of the controller, a baseline bode fingerprint pertaining to a state associated with the processing chamber; and storing, in computer storage, the baseline bode fingerprint to be used in performing diagnostics of the processing chamber.

6. The non-transitory computer-readable storage medium of claim 5, wherein the plurality of operations further comprises:

receiving, from the processing chamber at a later point in time, (i) measurement values of an updated combined signal based on injection of the alternating signal wave onto an updated first output signal of the controller, and (ii) measurement values of an updated second output signal of the controller that incorporates feedback from the processing chamber;

generating, based on the measurement values of the updated combined signal and measurement values of the updated second output signal, an updated bode fingerprint;

detecting an amount of change between the baseline bode fingerprint and the updated bode fingerprint; and alerting an operator of a defect in response to determining that the amount of change is greater than a threshold value.

7. The non-transitory computer-readable storage medium of claim 6, wherein the updated bode fingerprint is generated based on updated bode plot data, and wherein the plurality of operations further comprises:

calculating, using conductance curves of the updated bode plot data, a gain margin, a phase margin, and a bandwidth of a closed-loop frequency response at different frequencies of a signal generator used to generate the alternating signal wave; and calculating, based on at least one of the gain margin, the phase margin, or the bandwidth, one of a stability or robustness measurement of a chamber signal manager of the processing chamber.

8. The non-transitory computer-readable storage medium of claim 6, wherein the amount of change is with respect to a low frequency gain.

9. The non-transitory computer-readable storage medium of claim 6, wherein the amount of change is with respect to a resonance shift.

10. A method comprising:

injecting, by a signal generator of a chamber signal manager, an alternating signal wave into a mass flow controller (MFC) of the chamber signal manager;

controlling, by the MFC, a flow ratio controller (FRC) coupled to a processing chamber, the FRC to control pressure dynamics within the processing chamber via adjustments to a gas nozzle;

determining, by a manometer coupled to the processing chamber, a pressure measurement value of the processing chamber;

inputting, into a feedback controller using a comparator, a difference between a pressure setpoint and the pressure measurement value;

adjusting, by the feedback controller, the pressure dynamics within the processing chamber in response to the difference; and sending, by the chamber signal manager, the alternating signal wave, the output of the FRC, and the pressure measurement value to a diagnostic server to generate a baseline bode fingerprint to be used in performing diagnostics of the processing chamber.

11. The method of claim 10, wherein adjusting comprises adjusting conductance of a symmetric flow valve of a vacuum pump of the processing chamber.

12. The method of claim 10, further comprising generating, by the signal generator employing a second order digital filter, the alternating signal wave as a sinusoidal waveform.

13. The method of claim 10, further comprising continuously changing, by the signal generator, a frequency of the alternating signal wave in a user-defined frequency range.

14. The method of claim 10, further comprising:

performing the injecting, the controlling, the determining, the inputting, and the adjusting at a later point in time to generate an updated alternating signal wave, an updated output of the FRC, and an updated pressure measurement value; and sending the updated alternating signal wave, the updated output of the FRC, and the updated pressure measurement value to the diagnostic server to generate an updated bode fingerprint to be compared with the baseline bode fingerprint.

15. A method comprising:
receiving, from a chamber signal manager of a processing chamber:
  an alternating signal wave injected into a mass flow controller (MFC); and
  a pressure measurement value detected by a manometer coupled to the processing chamber;
generating, by a processor, a first baseline bode fingerprint based on at least the alternating signal wave and the pressure measurement value; and
storing, by the processor within a computer storage, the first baseline bode fingerprint for later use in processing chamber diagnostics.

16. The method of claim 15, further comprising:
calculating a complementary response of the processing chamber that is responsive to a difference between a pressure setpoint and the pressure measurement value;
calculating a closed-loop sensitivity response; and
combining complementary response data and closed-loop sensitivity data within first bode plot data as part of the first baseline bode fingerprint.

17. The method of claim 15, further comprising:
receiving, from the chamber signal manager, an output of a flow ratio controller (FRC) coupled to the MFC;
generating, by the processor, a second baseline bode fingerprint based on the alternating signal wave and the output of the FRC; and
storing, within the computer storage, the second baseline bode fingerprint to be used in performing diagnostics of the processing chamber.

18. The method of claim 15, further comprising:
receiving, from the chamber signal manager at a later point in time:
  an updated alternating signal wave injected into the MFC; and
  an updated pressure measurement value detected by the manometer;
generating, by the processor, an updated first bode fingerprint based on the updated alternating signal wave and the updated pressure measurement value;
detecting an amount of change between the first baseline bode fingerprint and the updated first bode fingerprint; and
setting a fault, by the processor, in response to determining that the amount of change is greater than a threshold value.

19. The method of claim 18, wherein the first baseline bode fingerprint is based on first bode plot data and the updated first bode fingerprint is based on second bode plot data, the method further comprising:
calculating, using conductance curves of at least one of the first or second bode plot data, a gain margin, a phase margin, or a bandwidth of a closed-loop frequency response at different frequencies of a signal generator that generates the updated alternating signal wave; and
calculating, based on at least one of the gain margin, the phase margin, or the bandwidth, one of a stability or robustness measurement of a chamber management system that includes the chamber signal manager and the processing chamber.

20. The method of claim 18, wherein the chamber signal manager further comprises a flow ratio controller (FRC) coupled to the MFC, the method further comprising determining, from the updated first bode fingerprint, the fault to be an issue with one of the MFC or the FRC.

21. The method of claim 18, wherein the chamber signal manager further comprises a symmetric flow valve to adjust a pressure within the processing chamber, the method further comprising determining, from the updated first bode fingerprint, the fault to be an issue with the symmetric flow valve.

* * * * *